(12) United States Patent
Lee (10) Patent No.: US 9,496,498 B2
(45) Date of Patent: Nov. 15, 2016

(54) METHOD OF MANUFACTURING ORGANIC LIGHT EMITTING DIODE DISPLAY

(71) Applicant: Samsung Display Co., Ltd., Yongin, Gyeonggi-Do (KR)

(72) Inventor: A-Rong Lee, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 86 days.

(21) Appl. No.: 14/024,750

(22) Filed: Sep. 12, 2013

(65) Prior Publication Data

US 2014/0346450 A1 Nov. 27, 2014

(30) Foreign Application Priority Data

May 27, 2013 (KR) ........................ 10-2013-0059848

(51) Int. Cl.
| | |
|---|---|
| *H01L 29/08* | (2006.01) |
| *H01L 51/00* | (2006.01) |
| *H01L 27/32* | (2006.01) |
| *H01L 51/56* | (2006.01) |

(52) U.S. Cl.
CPC ....... *H01L 51/0007* (2013.01); *H01L 27/3246* (2013.01); *H01L 51/56* (2013.01)

(58) Field of Classification Search
CPC ........... H01L 27/3246; H01L 51/0005; H01L 51/0007; H01L 51/56

USPC .................................................. 257/98–100
See application file for complete search history.

(56) References Cited

U.S. PATENT DOCUMENTS

| | | | | |
|---|---|---|---|---|
| 6,630,785 | B1 * | 10/2003 | Lu ....................... | H01L 27/3283 313/498 |
| 2002/0145382 | A1 * | 10/2002 | Lu ........................... | H01L 51/56 313/504 |
| 2007/0252518 | A1 * | 11/2007 | Lee et al. ...................... | 313/504 |
| 2009/0309489 | A1 * | 12/2009 | Takata ................ | H01L 51/5237 313/504 |
| 2010/0240160 | A1 * | 9/2010 | Lee et al. ......................... | 438/34 |
| 2013/0234126 | A1 * | 9/2013 | Nakatani ............. | H01L 27/3246 257/40 |

FOREIGN PATENT DOCUMENTS

| | | |
|---|---|---|
| KR | 1020070049396 A | 5/2007 |
| KR | 1020100127183 A | 12/2010 |

\* cited by examiner

*Primary Examiner* — John C Ingham
*Assistant Examiner* — Frederick B Hargrove
(74) *Attorney, Agent, or Firm* — Cantor Colburn LLP (57) ABSTRACT

A method of manufacturing an organic light-emitting diode display includes disposing a first electrode on a substrate on which a plurality of transistors is disposed, disposing a pixel definition layer on the substrate to cover a part of the first electrode, disposing a solvent layer on the first electrode, disposing an organic layer on the pixel definition layer and the solvent layer, removing the solvent layer and disposing a second electrode on the organic layer.

7 Claims, 9 Drawing Sheets

METHOD OF MANUFACTURING ORGANIC LIGHT EMITTING DIODE DISPLAY

This application claims priority to Korean Patent Application No. 10-2013-0059848 filed on May 27, 2013, and all the benefits accruing therefrom under 35 U.S.C. §119, the entire contents of which are incorporated herein by reference.

BACKGROUND (a) Field

The invention relates to a method of manufacturing an organic light emitting diode ("OLED") display.

(b) Description of the Related Art

Flat panel displays are generally classified into a light emitting type display and a light receiving type display. The light emitting type display includes a flat cathode ray tube, a plasma display panel ("PDP"), an electroluminescent device and a light emitting diode, for example. The light receiving type display includes a liquid crystal display ("LCD"), for example.

Among flat panel displays, the electroluminescent device attracts attention as a next-generation display device due to a wide view angle, high contrast and high response speed.

The electroluminescent device is generally categorized into an inorganic electroluminescent device and an organic electroluminescent device according to a material of an emission layer.

The organic electroluminescent device is a self-luminance display that emits light according to electrical excitation of an organic fluorescent compound and is considered as a next-generation display capable of effectively solving problems of LCDs since the organic electroluminescent device is driven at a substantially low voltage and easily formed in a compact structure, and has a wide view angle and rapid response speed.

The organic electroluminescent device generally includes an emission layer formed of an organic material and interposed between an anode including Indium Tin Oxide ("ITO"), for example, and a cathode.

When positive and negative voltages are respectively applied to the anode and cathode of the organic electroluminescent device, holes injected from the anode are moved to the emission layer via a hole transport layer, electrons injected are moved from the cathode to the emission layer via an electron transport layer and the electrons and holes are recombined in the emission layer, generating excitons.

As the excitons are dropped from an exited state to a ground state, fluorescent molecules of the emission layer emit light, forming an image. A full color organic electroluminescent device includes pixels emitting red ("R"), green ("G") and blue ("B") lights to display full-color images.

In the above-described organic electroluminescent device, a pixel definition layer is formed on both ends of the anode.

A predetermined opening is defined in the pixel definition layer and then an organic emission member and the cathode are sequentially formed on the anode exposed through the opening.

The organic emission member may include an organic emission layer and the electron transport layer, an electron injection layer, a hole transport layer and a hole injection layer disposed on top and bottom surfaces of the organic emission layer.

SUMMARY

The invention has been made in an effort to provide a method of manufacturing an organic light-emitting diode ("OLED") display having advantages of forming a uniform common layer when an organic emission member is disposed in a bank.

An exemplary embodiment of the invention provides a method of manufacturing an OLED display, including disposing a first electrode on a substrate on which a plurality of transistors is disposed, disposing a pixel definition layer on the substrate to cover a part of the first electrode, disposing a solvent layer on the first electrode, disposing an organic layer on the pixel definition layer and the solvent layer, removing the solvent layer, and disposing a second electrode on the organic layer.

The disposing of the organic layer on the pixel definition layer and the solvent layer may include disposing an organic solvent layer on the pixel definition layer and the solvent layer, and drying the organic solvent layer at a temperature in a first temperature range to form the organic layer in a form of a film.

The solvent layer and the organic solvent layer may be formed using at least one of inkjet printing and nozzle printing The solvent layer may include a material that remains separate from the organic solvent layer.

The boiling point of the solvent layer may be greater than that of the organic solvent layer.

The first temperature range may be equal to or greater than the boiling point of the organic solvent layer and less than the boiling point of the solvent layer.

The removing the solvent layer may include drying the solvent layer at a temperature in a second temperature range.

The second temperature range may be equal to or greater than the boiling point of the solvent layer.

The organic layer may be disposed on the pixel definition layer and the solvent layer such that the organic layer contacts with surfaces of the first electrode and the pixel definition layer after the removing the solvent layer.

An exemplary embodiment of the invention provides an organic light-emitting diode display provided by the illustrated exemplary embodiment of the method, including an opening defined in the pixel definition layer and exposing the first electrode, and the organic layer in the opening, where the organic layer in the opening contacts the exposed first electrode and surfaces of the pixel definition layer.

A first portion of the organic layer may be in the opening, and a second portion of the organic layer may be on portions of the pixel definition layer defining the opening, and the first and second portions of the organic layer may be in different planes.

The pixel definition layer may overlap opposing ends of the first electrode, to define an opening which exposes a portion of the first electrode.

The second electrode may be in the opening and may contact surfaces of the pixel definition layer.

The OLED display according to an exemplary embodiment of the invention can form a uniform common layer when an organic emission member is formed in a bank.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

During a process of forming an organic emission member on a pixel definition layer and in an opening, an organic material of an organic emission member is moved from a top of the pixel definition layer to a bottom of the opening according to potential energy and thus the organic emission layer is formed to have an uneven thickness.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

In the drawings, dimensions and thicknesses of components are exaggerated, omitted or schematically illustrated for clarity and convenience of description. In addition, dimensions of constituent elements do not entirely reflect actual dimensions thereof.

In the drawings, the thickness of layers, films, panels, regions, etc., are exaggerated for clarity. In addition, thicknesses of some layers and areas are exaggerated for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising," will be understood to imply the inclusion of stated elements but not the exclusion of any other elements. Furthermore, the expression "on" or "under" may be used herein to represent the relationship of one element to another element as illustrated in the figures. It will be understood that this expression is intended to encompass different orientations of the elements in addition to the orientation depicted in the figures, namely, to encompass both "on" and "under".

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A description will be given of a method of manufacturing an organic light-emitting diode ("OLED") display according to an exemplary embodiment of the invention with reference to the attached drawings.

Figure 1:
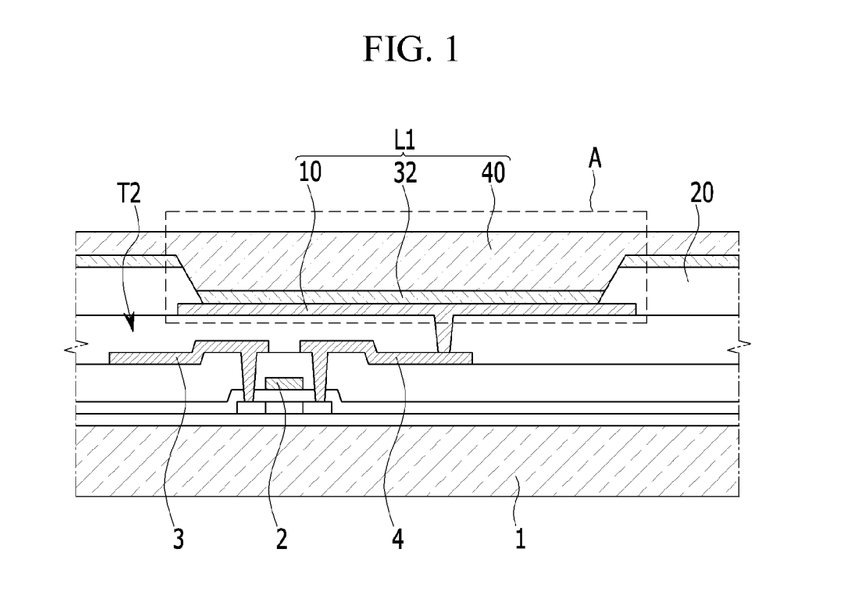
FIG. 1 is a cross-sectional view of an organic light-emitting diode ("OLED") display manufactured by a method of manufacturing an exemplary embodiment of an OLED display according to the invention.

FIG. 1 is a cross-sectional view of an OLED display manufactured by the method of manufacturing an OLED display according to an exemplary embodiment of the invention.

One pixel of the OLED display includes an OLED element L1 and a driving circuit.

Referring to FIG. 1, the OLED element L1 includes a first electrode (also referred to as "hole injection electrode") 10, an organic layer 32 and a second electrode (also referred to as "electron injection electrode") 40.

The organic layer 32 may include an emission layer (not shown) emitting light and organic layers (not shown) for efficiently transferring hole or electron carriers to the emission layer.

The organic layers may be a hole injection layer (not shown) and a hole transport layer (not shown) disposed between the first electrode 10 and the emission layer and an electron injection layer and an electron transport layer disposed between the second electrode 40 and the emission layer.

The driving circuit includes at least two thin film transistors ("TFTs") and at least one storage capacitor. The TFTs include a switching transistor and a driving transistor.

The driving circuit has a general configuration and thus detailed description thereof is omitted and only a driving transistor T2 shown in FIG. 1 will be briefly described.

The driving transistor T2 is connected to the storage capacitor and provides an output current $I_{OLED}$ in proportion to a square of a difference between a threshold voltage thereof and a voltage stored in the storage capacitor to the OLED element L1. The OLED element L1 emits light according to the output current $I_{OLED}$.

The driving transistor T2 includes a gate electrode 2, a source electrode 3 and a drain electrode 4. In an exemplary embodiment, the first electrode 10 of the OLED element L1 may be connected to the drain electrode 4 of the driving transistor T2. However, the configuration of the pixel is not limited thereto and may be modified in various manners.

FIGS. 2 to 8 are cross-sectional views sequentially illustrating a process of forming (e.g., providing) a part A of the exemplary embodiment of OLED display of FIG. 1. FIG. 9 is a flowchart illustrating a method of manufacturing an OLED display according to an exemplary embodiment of the invention.

A description will be given of the process of forming the part A, that is, the OLED element L1 and the pixel definition layer 20, shown in FIG. 1.

Figure 2:
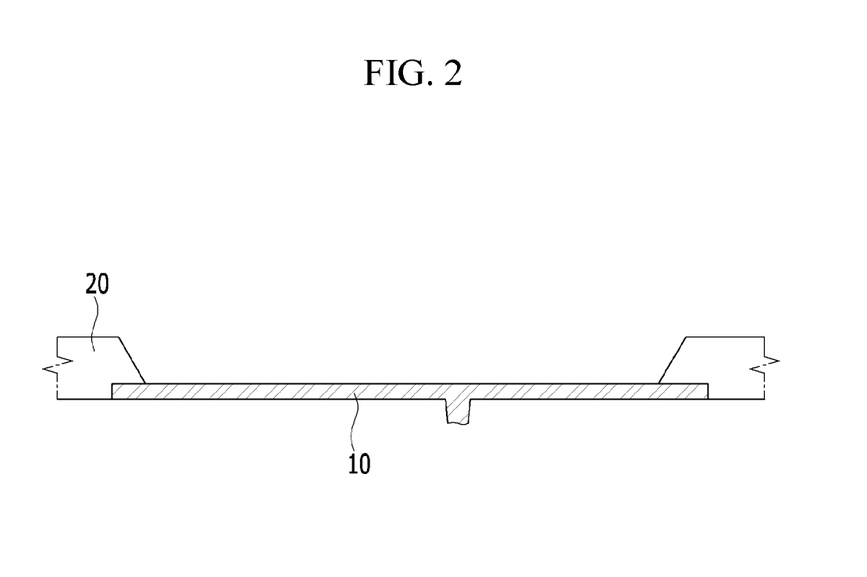
FIGS. 2 to 8 are cross-sectional views sequentially illustrating a process of forming a part A of the exemplary embodiment of OLED display of FIG. 1.

Referring to FIGS. 2 and 9, the method of manufacturing an OLED display according to an exemplary embodiment of the invention includes disposing the first electrode 10 on a substrate 1 on which the transistor T2 is disposed (S100).

As described above with regard to FIG. 1, the first electrode 10 may be connected to the drain electrode 4 of the driving transistor T2. A connecting part will be described later.

Once the first electrode 10 is disposed, the pixel definition layer 20 is disposed to cover a part of the first electrode 10 (S200). In providing the pixel definition layer 20, an opening is defined by portions of the pixel definition layer 20 separated from each other. These portions of the pixel definition layer 20 may define banks between which other elements of the structure are disposed.

In the illustrated exemplary embodiment, the pixel definition layer 20 covers opposing ends of the first electrode 10 in FIG. 2, but the invention is not limited thereto.

Figure 3:
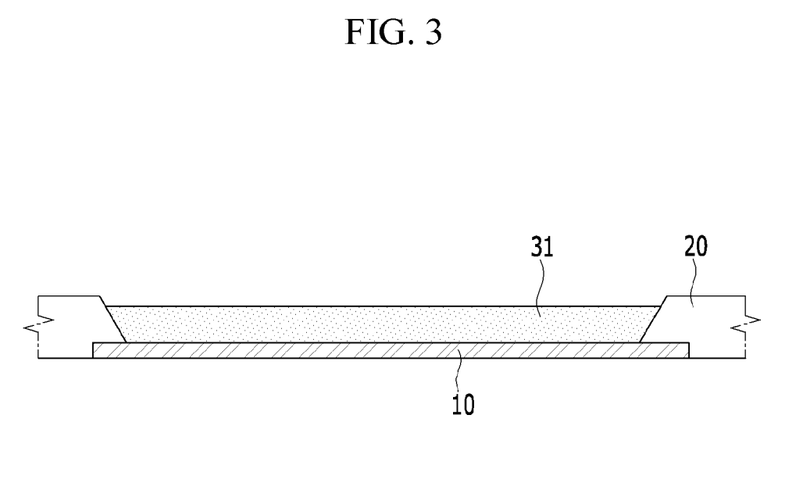

Referring to FIGS. 3 and 9, a solvent layer 31 is disposed in a bank defined by the pixel definition layer 20 and the first electrode 10 (S300). An opening is defined in the pixel definition layer 20 and exposes the first electrode 10. The opening is between inner walls of the bank defined by the pixel definition layer 20.

The solvent layer 31 includes a material having a solvent property only, which is not mixed with and remains separate from an organic solvent layer 321 or the organic layer 32, which will be described below.

In an exemplary embodiment, a boiling point of the solvent layer 31 is greater than the room temperature such that the solvent layer 31 is not dried at the room temperature.

In an exemplary embodiment, the solvent layer 31 may be disposed in the bank using inkjet printing or nozzle printing.

Figure 4:
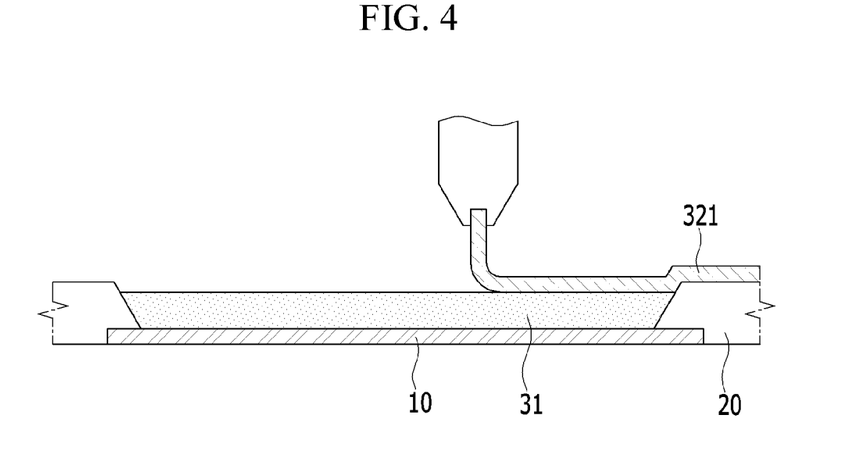

Referring to FIG. 4, when the solvent layer 31 is disposed in the bank such that heights of the solvent layer 31 and the pixel definition layer 20 are similar to each other, the organic solvent layer 321 is disposed on the pixel definition layer 20 and the solvent layer 31.

The organic solvent layer 321 may also be disposed using inkjet printing or nozzle printing.

As described above, the organic solvent layer 321 is disposed such that the organic solvent layer 321 is not mixed with and remains separate from the solvent layer 31 disposed under the organic solvent layer 321, and the organic solvent layer 321 includes a material that forms a film when dried.

In an exemplary embodiment, boiling point of the organic solvent layer 321 is greater than the room temperature and less than that of the solvent layer.

Figure 5:
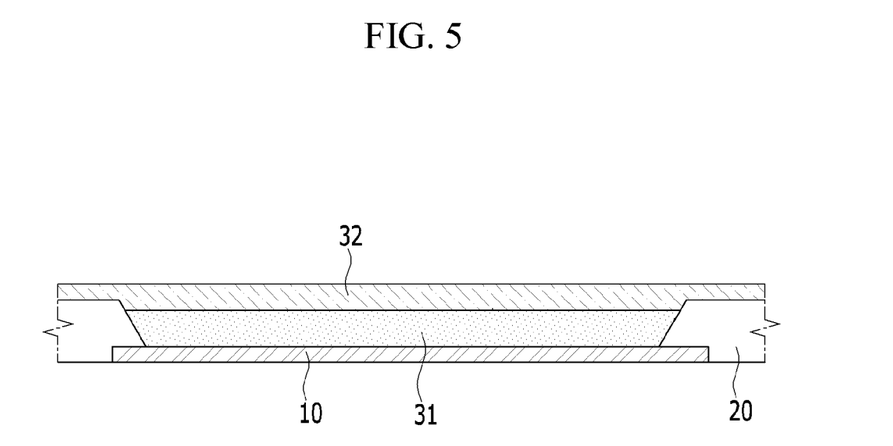

Once the organic solvent layer 321 is disposed on the pixel definition layer 20 and the solvent layer 31, the organic solvent layer 321 is dried to form the organic layer 32 in a form of a film having a uniform thickness, as shown in FIGS. 5 and 9 (S400).

Here, drying process is performed at a temperature equal to or greater than the boiling point of the organic solvent layer 321 but less than the boiling point of the solvent layer 31 such that the organic solvent layer 321 is dried whereas the solvent layer 31 is not dried.

In the disclosure, a temperature equal to or greater than the boiling point of the organic solvent layer 321 and less than the boiling point of the solvent layer 31 is referred to as a first temperature range.

Subsequently, the solvent layer 31 disposed under the organic layer 32 in the form of a film is removed (S500).

More specifically, the solvent layer 31 may be removed through a process of drying the solvent layer 31 at a temperature equal to or greater than the boiling point of the solvent layer 31.

The drying process may be performed by applying a temperature equal to or greater than the boiling point of the solvent layer 31 to a whole portion of the solvent layer 31 or only a part of the solvent layer 31.

Figure 6:
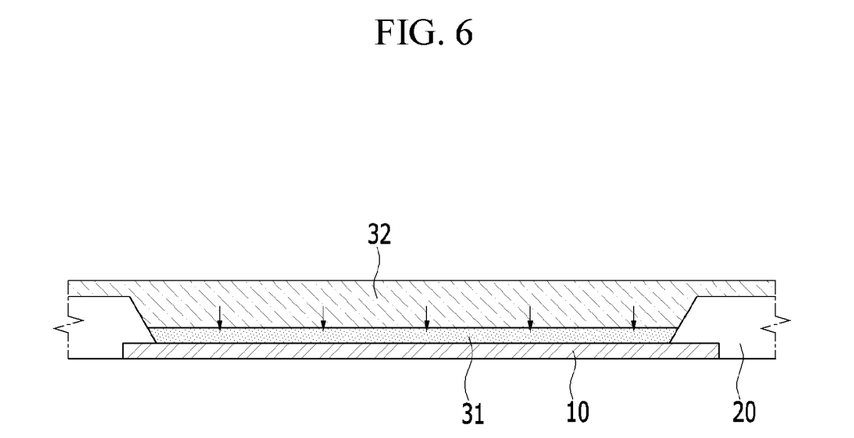

The solvent layer 31 has only the solvent property because it is not mixed with and remains separate from an OLED material, as described above. Accordingly, the solvent layer 31 may decrease in volume as shown in FIG. 6 and be finally eliminated as shown in FIG. 7 when dried, distinguished from forming the organic layer 32 from the organic solvent layer 321.

In the disclosure, a temperature equal to or greater than the boiling point of the solvent layer 31 is referred to as a second temperature.

Figure 7:
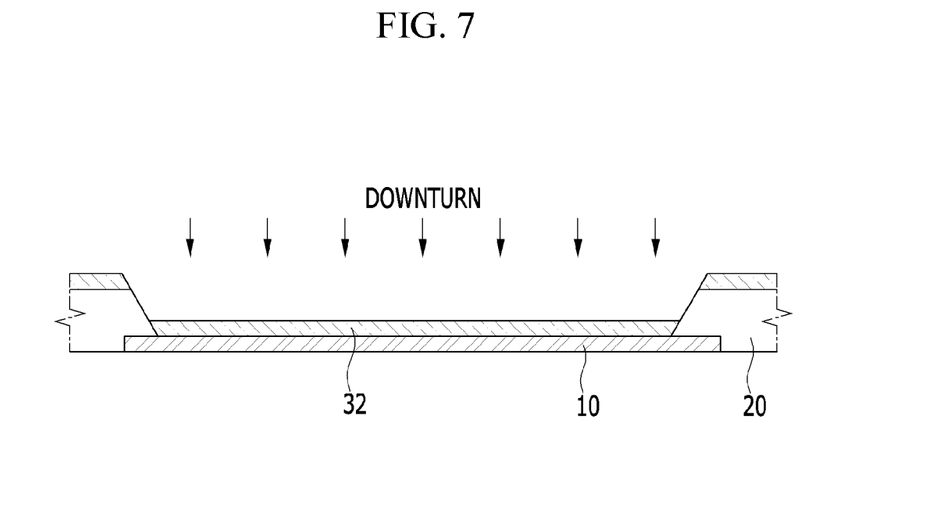

Referring to FIG. 7, the portion of the organic layer 32, disposed on the pixel definition layer 20 remains, and the portion thereof disposed on the solvent layer is moved downwardly to come into contact with the first electrode 10 as the solvent layer 31 is removed. That is, a first portion of the organic layer 32 disposed on the pixel definition layer 20 and a second portion thereof disposed on the solvent layer, are in different planes and may be separated from each other in the plan view and/or a cross-sectional thickness direction. The first and second portions of the organic layer 32 are formed from a same material layer (refer to FIGS. 4-6), and may be considered in a same layer of the OLED display.

At this time, the portion of the organic layer 32 disposed on the pixel definition layer 20 is naturally separated from the portion thereof disposed on the solvent layer according to a drying speed of the solvent layer.

Figure 8:
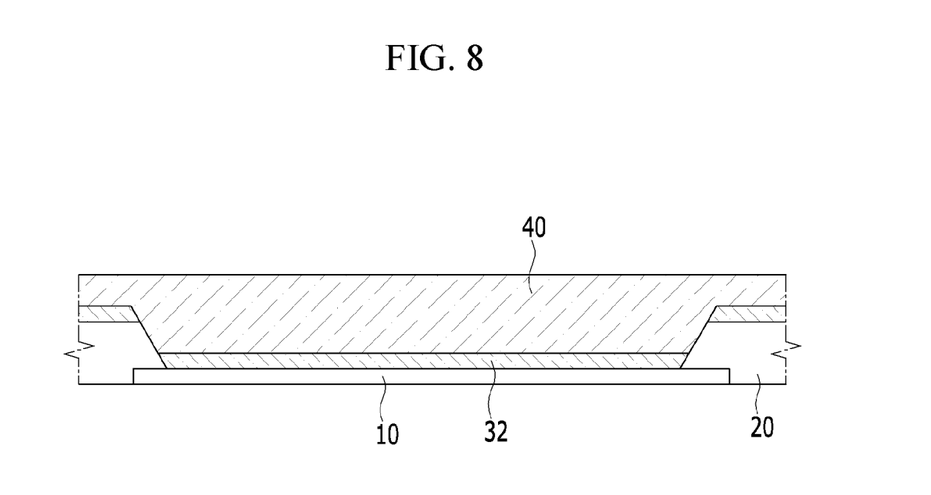
Figure 9:
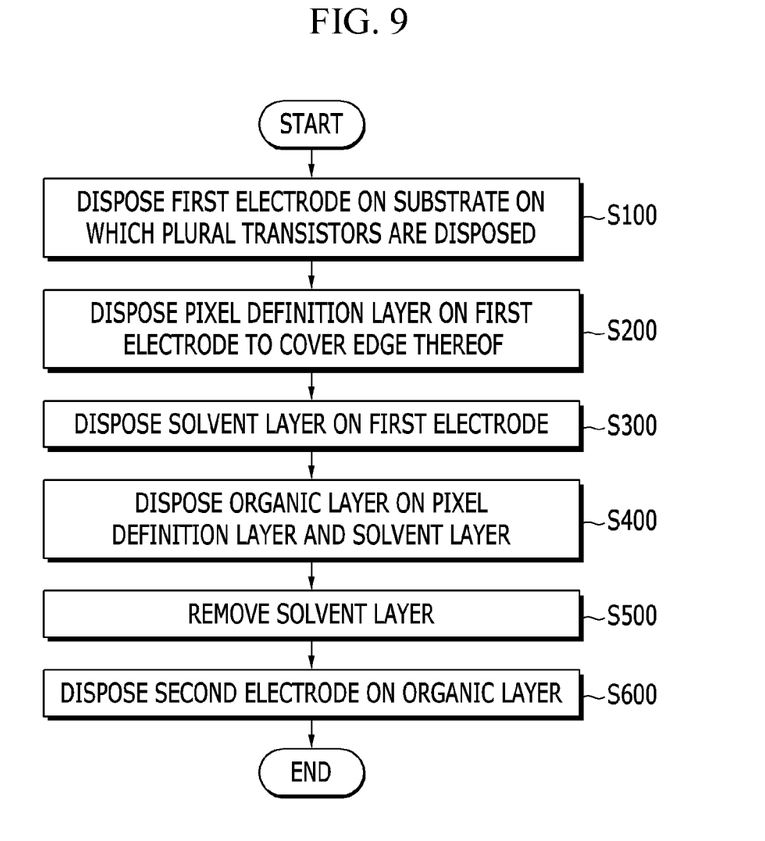
FIG. 9 is a flowchart illustrating a method of manufacturing an exemplary embodiment of an OLED display according the invention.

Referring to FIGS. 8 and 9, the second electrode 40 is disposed on the organic layer 32 having an even surface (S600).

According to an exemplary embodiment of the invention, the organic layer 32 may be disposed such that the organic layer 32 has an even surface in an emission area even when the bank is deep, and thus an OLED display having uniform surface characteristics can be manufactured.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing an organic light-emitting diode display, the method comprising:

disposing a first electrode on a substrate on which a plurality of transistors is disposed;

disposing a pixel definition layer on the substrate to cover a part of the first electrode;

disposing a solvent layer on the first electrode;

disposing an organic layer on an upper surface of the pixel definition layer opposing a lower surface of the pixel definition layer facing the substrate, and on the solvent layer;

removing the solvent layer;

separating the organic layer on the upper surface of the pixel definition layer from the organic layer on the first electrode; and disposing a second electrode on the organic layer, wherein a thickness of the second electrode on the organic layer taken along a direction perpendicular to a direction along which the organic layer extends is greater than a thickness of the second electrode on the pixel definition layer, wherein the disposing the organic layer on the pixel definition layer and the solvent layer comprises:

disposing an organic solvent layer on the pixel definition layer and the solvent layer; and drying the organic solvent layer at a temperature in a first temperature range to form the organic layer in a form of a film, and wherein a boiling point of the solvent layer is greater than that of the organic solvent layer.

2. The method of claim 1, wherein the solvent layer and the organic solvent layer are disposed using at least one of inkjet printing and nozzle printing.

3. The method of claim 1, wherein the solvent layer includes a material which remains separate from the organic solvent layer.

4. The method of claim 1, wherein the first temperature range is equal to or greater than the boiling point of the organic solvent layer and less than the boiling point of the solvent layer.

5. The method of claim 1, wherein the removing the solvent layer comprises drying the solvent layer at a temperature in a second temperature range.

6. The method of claim 5, wherein the second temperature range is equal to or greater than the boiling point of the solvent layer.

7. The method of claim 1, wherein the organic layer is disposed on the pixel definition layer and the solvent layer such that the organic layer contacts surfaces of the first electrode and the pixel definition layer, after the removing the solvent layer.

* * * * *